United States Patent
Eissa

[11] Patent Number: 6,150,010
[45] Date of Patent: Nov. 21, 2000

[54] INTEGRATED CIRCUIT INSULATOR

[75] Inventor: Mona Eissa, Plano, Tex.

[73] Assignee: Texas Instruments Incorporated, Dallas, Tex.

[21] Appl. No.: 08/811,383

[22] Filed: Mar. 4, 1997

[51] Int. Cl.[7] .............................. B32B 27/06; C08F 14/18; C08F 114/18; C08F 136/16
[52] U.S. Cl. ..................... 428/201; 428/421; 428/448; 428/450; 428/472; 526/242; 526/250; 526/251; 526/252; 526/253; 526/254
[58] Field of Search ..................... 428/201, 421, 428/422, 469, 472, 458, 446, 448, 450; 528/397; 526/242, 250, 251, 252, 253, 254

[56] References Cited

U.S. PATENT DOCUMENTS

| | | | |
|---|---|---|---|
| 5,110,903 | 5/1992 | Lee et al. | 528/397 |
| 5,210,341 | 5/1993 | Dolbier, Jr. et al. | 570/144 |
| 5,536,319 | 7/1996 | Wary et al. | 118/719 |
| 5,709,753 | 1/1998 | Olson et al. | 118/719 |

*Primary Examiner*—Vivian Chen
*Attorney, Agent, or Firm*—Carlton H. Hoel; Frederick J. Telecky, Jr.

[57] ABSTRACT

Intermetal level dielectrics comprise fluorinated polydimethylenenaphthalene derived from the following monomers wherein each of $R_1$, $R_2$, $R_3$, and $R_4$ is selected from the group consisting of H, F, and fluorocarbon groups

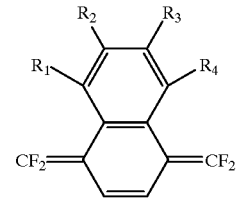

The dielectric and oxides may be between metal lines. Fluorination of the polydimethylenenaphthalene lowers dielectric constant and increases working temperature.

5 Claims, 6 Drawing Sheets

INTEGRATED CIRCUIT INSULATOR

BACKGROUND OF THE INVENTION

The invention relates to semiconductor devices, and, more particularly, to integrated circuit insulation and methods of fabrication.

Integrated circuits typically include field effect transistors with source/drains formed in a silicon substrate and insulated gates on the substrate together with multiple overlying metal (or polysilicon) interconnections formed in levels. An insulating layer lies between the gates/sources/drains and the interconnections formed from the first metal level (premetal dielectric) and also between successive metal levels (intermetal-level dielectric). Vertical vias in the insulating layers filled with metal (or polysilicon) provide connections between interconnections formed in adjacent metal levels and also between the gate/source/drain and the first metal level interconnections. Each insulating layer must cover the relatively bumpy topography of the interconnections of a metal level or the gates, and this includes crevices between closely spaced interconnects in the same metal level. Also, the dielectric constant of the insulating layer should be as low as practical to limit capacitive coupling between closely spaced interconnects in the same metal level and in adjacent overlying and underlying metal levels.

Various approaches to forming insulating layers over bumpy topography have been developed which all form a silicon dioxide (oxide) type insulator: reflowing deposited borophosphosilicate glass (BPSG), using spin-on glass (SOG), sputtering while depositing in plasma enhanced chemical vapor deposition (PECVD) with tetraethoxysilane (TEOS), etching back a stack of deposited glass plus spun-on planarizing photoresist, and chemical-mechanical polishing (CMP).

All these approaches have problems including the relatively high dielectric constant of silicon oxides: roughly 3.9. This limits how closely the interconnections can be packed and still maintain a low capacitive coupling.

Laxman, Low ε Dielectrics: CVD Fluorinated Silicon Dioxides, 18 Semiconductor International 71 (May 1995), summarizes reports of fluorinated silicon dioxide for use as an intermetal level dielectric which has a dielectric constant lower than that of silicon dioxide. In particular, PECVD using silicon tetrafluoride ($SiF_4$), silane ($SiH_4$), and oxygen ($O_2$) source gasses can deposit $SiO_xF_y$, with up to 10% fluorine and a dielectric constant in the range 3.0 to 3.7. But this dielectric constant still limits the packing density of interconnections.

Organic polymer insulators provide another approach to low dielectric constant insulators. Formation by chemical vapor deposition (CVD) ensures filling of crevices between closely spaced interconnections. Some integrated circuit fabrication methods already include polyimide as a protective overcoat. However, polyimide has problems including a dielectric constant of only about 3.2–3.4 and an affinity to absorb water which disrupts later processing when used as an intermetal level dielectric. On the positive side, it does have a temperature tolerance up to about 500° C.

Parylene is a generic term for a class of poly-para-xylylenes with structures such as the following:

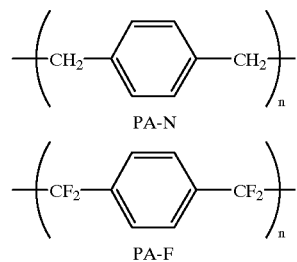

These polymers are members of a family of thermoplastic polymers that have low dielectric constants (e.g., 2.35 to 3.15), low water affinity, and may be conformally deposited from a vapor without solvents and high temperature cures. Parylene with hydrogen on the aliphatic carbons may be used at temperatures up to about 400° C. under an $N_2$ atmosphere, whereas aliphatic perfluorination increases the useful temperature to about 530° C.

You et al., Vapor Deposition of Parylene Films from Precursors, in Chemical Perspectives of Microelectronic Materials III, Materials Research Society Symposium Proceedings Nov. 30, 1992, discloses a method for fabrication of fluorinated parylene by starting with a liquid dibromotetra-fluoro-p-xylene precursor and then converting the precursor at 350° C. to active monomers which adsorb and polymerize at −15° C. on a substrate. The reaction looks like:

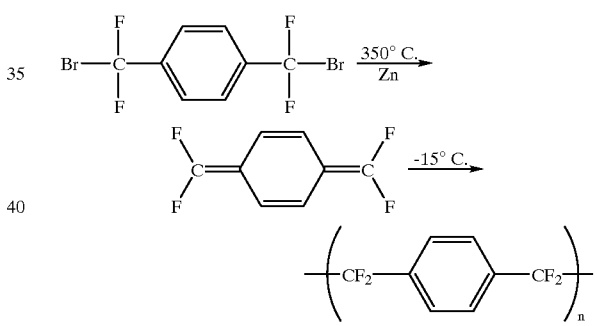

You et al. synthesize the precursor from the dialdehyde (terephthalaldehyde):

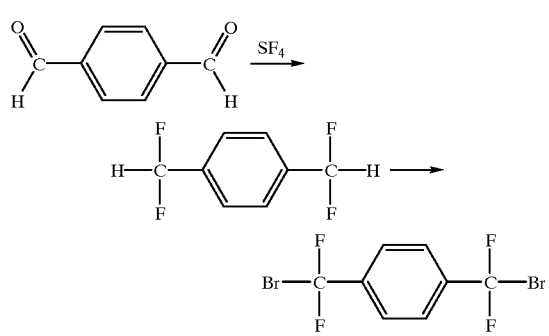

The benzene ring could also be (partially) fluorinated with standard halogenation methods. Such fluorination would lower the dielectric constant and increase the useful temperature.

The parylene films may also be deposited with the use of dimers of the active monomers as an intermediate product. See, You et al. and Dolbier et al., U.S. Pat. No. 5,210,341, as in the reaction:

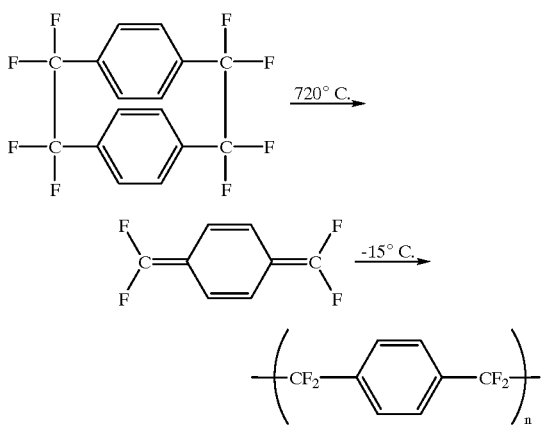

Moore et al., Chemical Vapor Deposition of Aromatic Polymers, . . . discloses further types of polymers for possible use as intermetal level dielectrics and which can be formed by vapor deposition. In particular, polynaphthalene and polyfluoronaphthalene polymerize from precursors 1,2-diethynylbenzene and 1,2-diethynyltetrafluorobenzene on a substrate at 350° C. by the reactions:

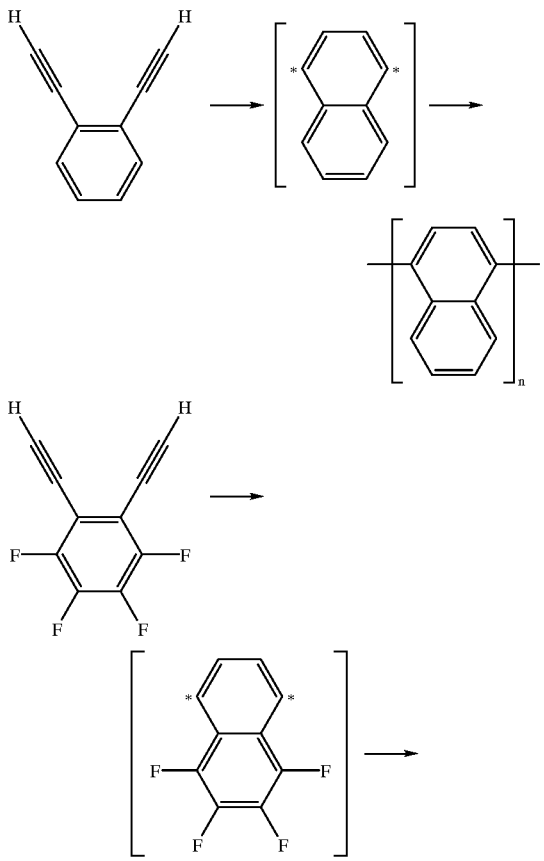

-continued

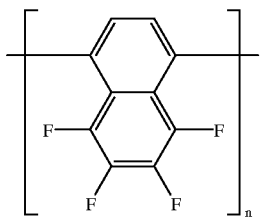

The polynaphthalene had a dielectric constant of about 2.4 and a decomposition temperature of about 575° C.; however, the 350° C. substrate temperature for polymerization may be too high for direct polymerization on aluminum lines because the aluminum may begin to form hillocks.

SUMMARY OF THE INVENTION

The present invention provides a fluorinated naphthalenophane ($\alpha$, $\alpha$, $\alpha'$, $\alpha'$fluoro-cyclo-1,4-dimethylenenaphthalene) and vapor phase deposition of fluorinated polydimethylenenapthalene. The fluorinated polydimethylenenaphthalene thin film has a low dielectric constant and high decomposition temperature and may be used as an intermetal level dielectric for integrated circuits. The polymerization occurs at a moderate temperature.

Advantages include an interlevel dielectric with low dielectric constant, high thermal stability, acceptable thermal conductivity, good adhesion to oxide and metal, mechanical strength, conformal deposition filling narrow crevices, ease of patterning and etching, low film stress, low water absorption, and high electrical resistivity.

BRIEF DESCRIPTION OF THE DRAWINGS

The drawings are schematic for clarity.

DESCRIPTION OF THE PREFERRED EMBODIMENTS

First preferred embodiment

Figure 1A:
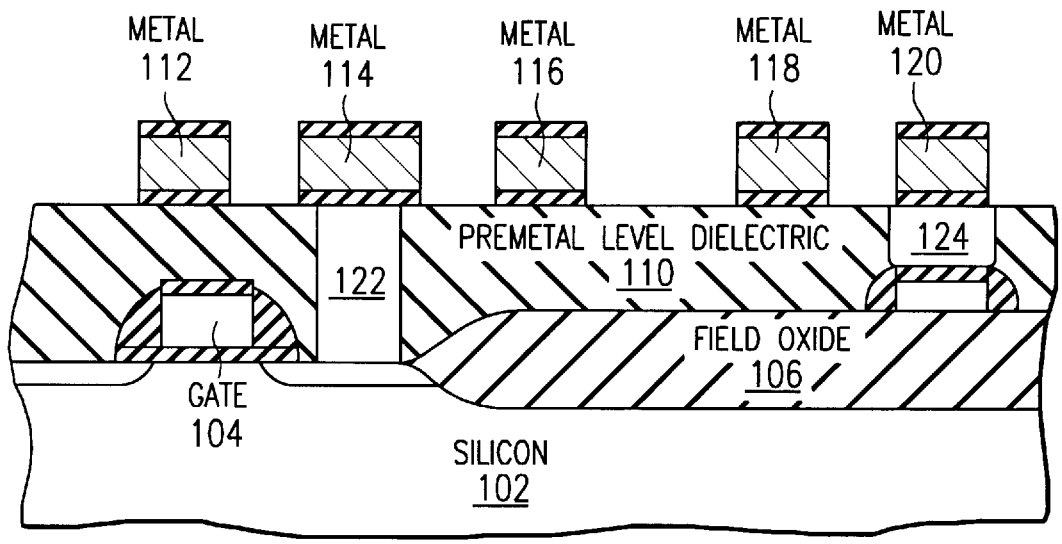
FIGS. 1a–c illustrate in cross sectional elevation views the steps of a first preferred embodiment and method.
Figure 1B:
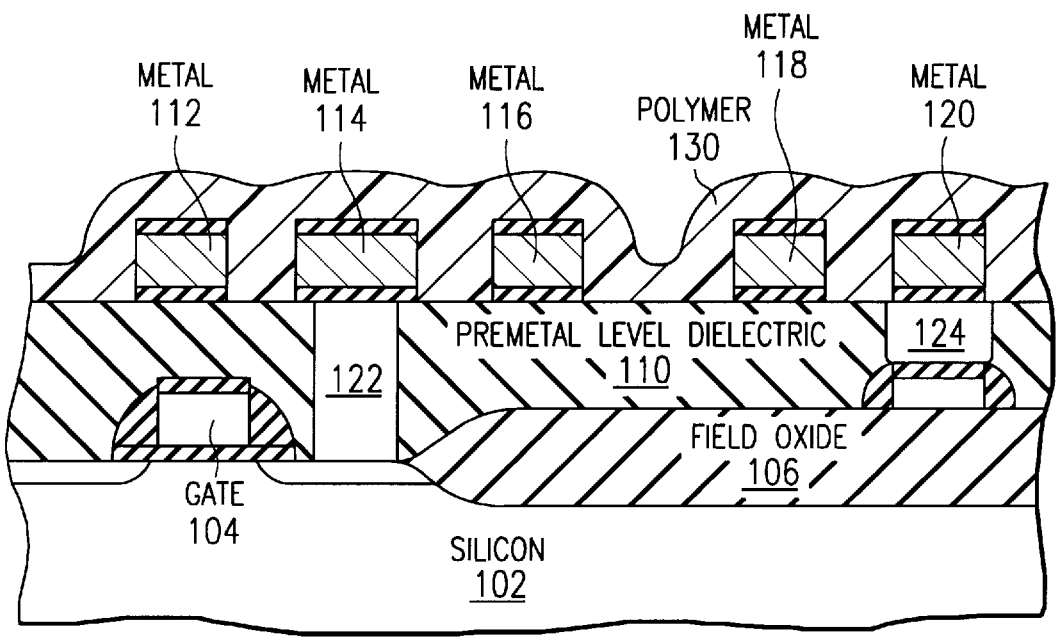
Figure 1C:
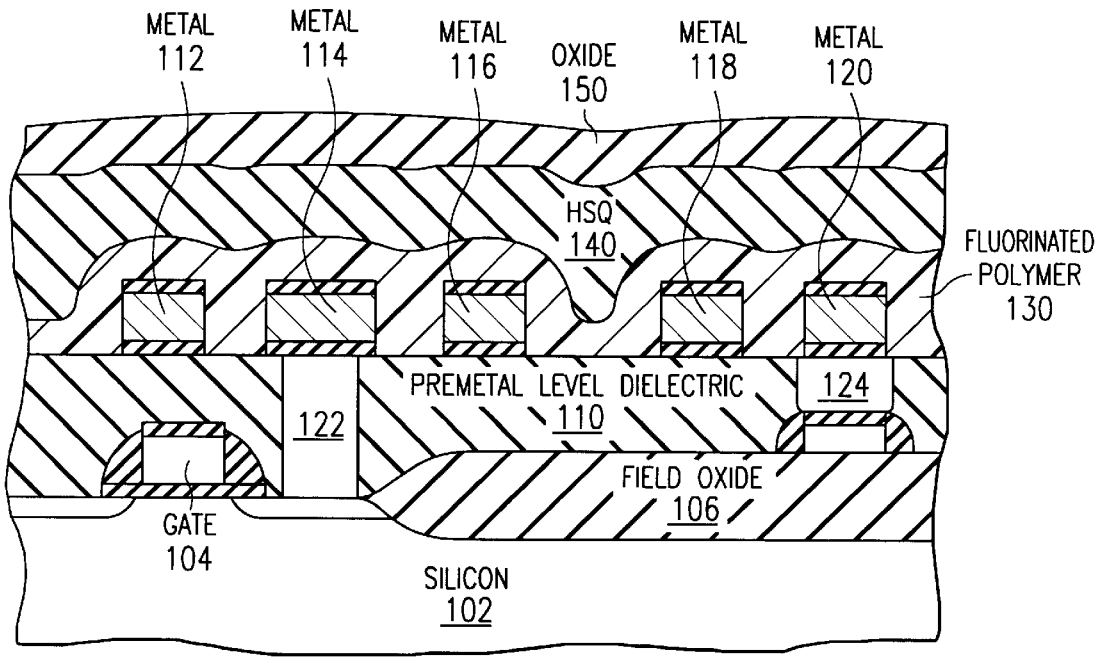

FIGS. 1a–c illustrate in cross sectional elevation view the steps of a first preferred embodiment method of dielectric formation between metal lines during integrated circuit fabrication. In particular, start with the partially fabricated circuit of FIG. 1a which includes polysilicon gate 104 and field oxide 106 on silicon substrate 102 and lying under premetal level dielectric (PMD) 110 (which may be silicon dioxide) with metal lines 112–120 on PMD 110 and metal filled vias 122–124 extending through PMD 110. The metal lines may be made of aluminum with TiN cladding on top and bottom. Metal lines 112–120 are 0.35–0.5 µm wide and 0.5 µm high with only 0.35–0.5 µm spacing between lines 112–116 and between lines 118–120. Thus the dielectric constant of the insulator between the metal lines should be as small as possible to limit capacitive coupling.

Figure 2:
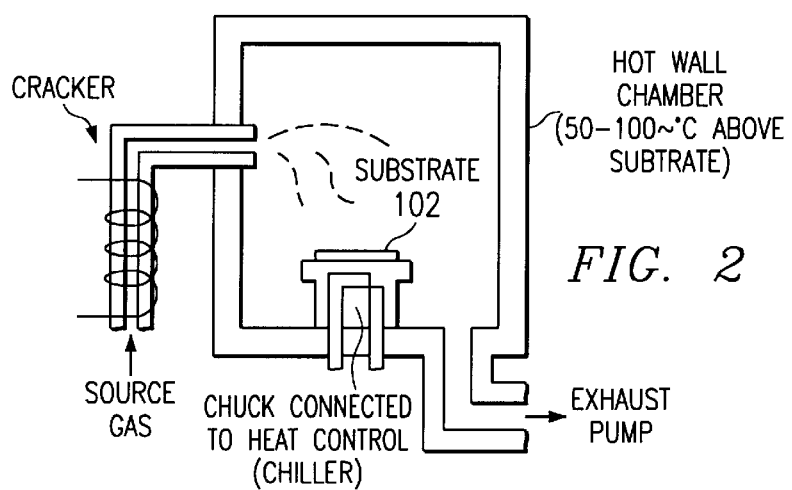
FIG. 2 shows a deposition apparatus.

Conformally deposit a 0.25 µm thick layer of fluorinated polydimethylenenaphthalene 130 on PMD 110 and metal lines 112–120 as shown in FIG. 1b by the following reaction in a low pressure vapor deposition polymerization chamber with cracker as illustrated in cross sectional view by FIG. 2. The number of fluorine substitutions on the aromatic rings may vary from 0 to 4; the following reaction shows all four aromatic sites with fluorine substitutions:

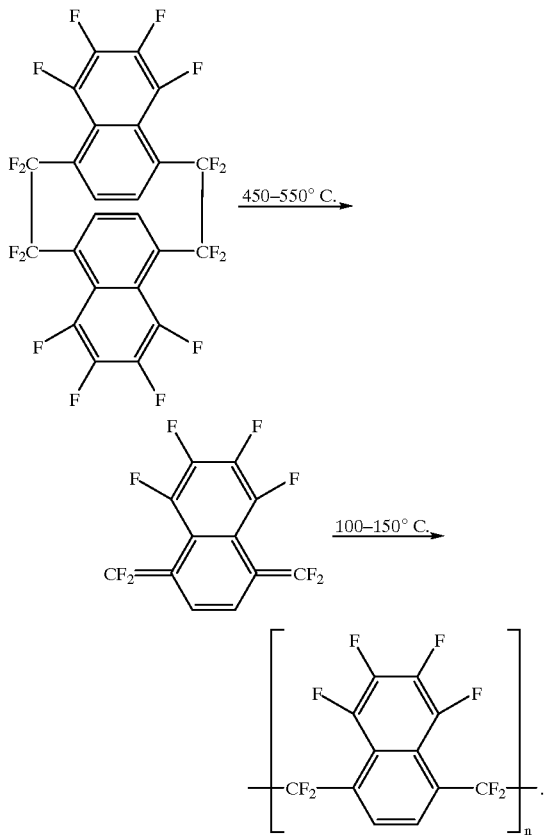

Subliminate the dimer from the solid phase directly to the gas phase for input to the cracking furnace. Sublimation temperatures may be in the range of 100–250° C. The heated cracker may have a temperature in the range of 300–800° C. and the substrate 102 is less than 350° C., probably in the range of 100–150° C. The walls of chamber may be heated relative to the substrate to deter polymerization on them, so substrate 102 is the only object exposed to the monomers with a low enough temperature for polymerization.

After the deposition of fluorinated polydimethylenenaphthalene 130, spin on layer 140 of planarizing glass such as hydrosilsesquioxane (HSQ) to an average thickness of about 0.5 µm; the thickness of HSQ layer 140 will be only about 0.2 µm over the metal lines. Cure the HSQ. Then deposit oxide layer 150 to a thickness of about 0.3 µm on HSQ layer 140; see FIG. 1c. The deposition may be done by plasma-enhanced TEOS deposition and completes the first intermetal level dielectric (ILD) which consists of fluorinated polynaphthalene 130, HSQ 140, plus oxide 150. The low dielectric constant material (fluorinated polydimethylenenaphthalene 130) surrounds the metal lines.

Alternative spin on glasses could be used and an etchback may be included to thin the dielectric layer. In particular, the spin on glass could be totally removed on polydimethylenenaphthalene 130 over the metal lines and only remain in the crevices and low areas between sets of metal lines.

Fluorinated polydimethylenenaphthalene 130 provides a low dielectric constant, high thermal stability, conformal deposition filling narrow crevices, ease of patterning and etching, low film stress, low water absorption, high electrical resistivity, high breakdown electric field, and low leakage currents with deposition at temperatures low enough to not cause hillocks in the aluminum-based metallization schemes.

Precursor preparation

The dimer precursor may be prepared from 1,4-naphthdialdehyde analogous to the preparations of dibromotetrafluoroxylene by You et al. and dimerization by Dolbier et al.:

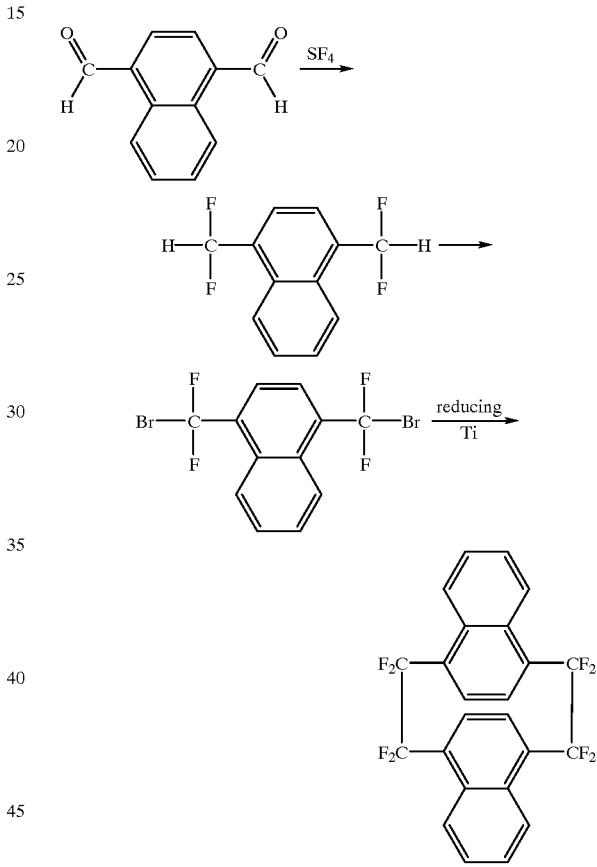

Direct monomer vapor deposition

An alternative vapor deposition polymerization analogizes You et al. and bypasses the dimer to directly strip the bromine from the dibromoprecursor to form active monomers. A reducing agent can be used to strip the bromine and then the monomers polymerize as in the following reaction:

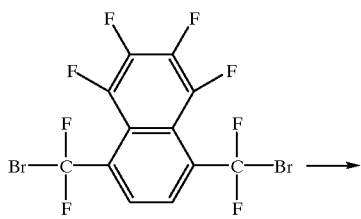

-continued

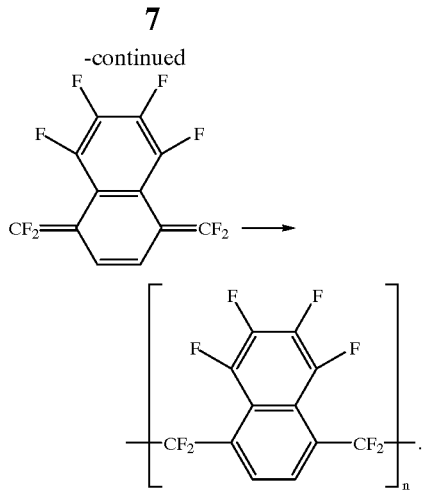

Imbedded polymer preferred embodiment

Figure 3A:
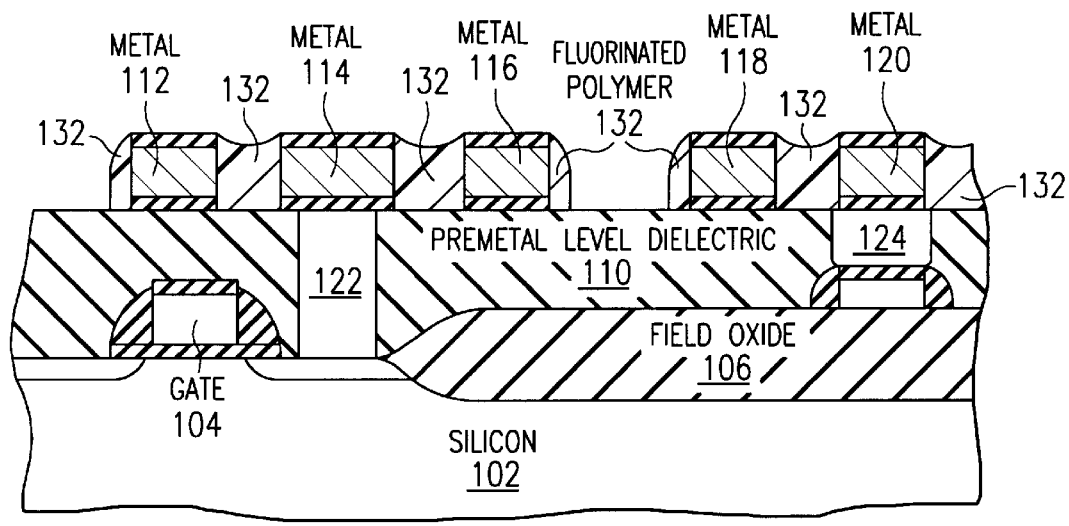
FIGS. 3a–b illustrate steps of a second preferred embodiment and method.
Figure 3B:
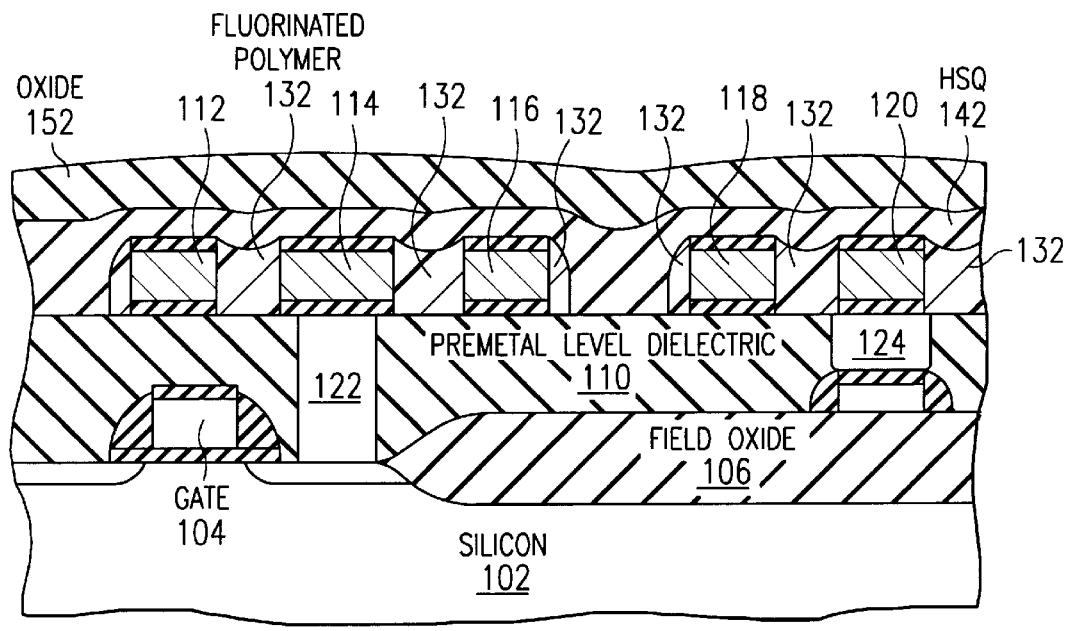

FIGS. 3a–b illustrate a second preferred embodiment method for ILD fabrication. In particular, begin as with the first preferred embodiment and deposit fluorinated polydimethylenenaphthalene over metal lines as shown in FIGS. 1a–b. Then anisotropically etchback fluorinated polydimethylenenaphthalene 130 with a fluorine oxygen-based plasma so that fluorinated polydimethylenenaphthalene only remains in the spaces between adjacent metal lines plus possibly on the sidewalls; see FIG. 3a showing etched back fluorinated polydimethylenenaphthalene portions 132.

Next, again spin on and cure layer 142 of HSQ. Then deposit oxide layer 152 to a thickness of about 0.2 $\mu$m, on HSQ layer 142; see FIG. 3b. The oxide deposition again may be by plasma-enhanced TEOS deposition and completes the intermetal level dielectric which consists of fluorinated polydimethylenenaphthalene 132 between the metal lines, planarizing HSQ 142, plus oxide 152.

Multiple metal layers preferred embodiment

Figure 4A:
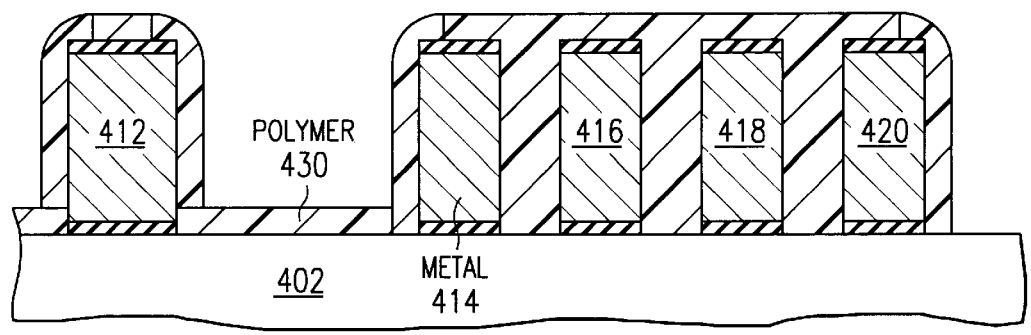
FIGS. 4a–c show successive applications of the second preferred embodiment.
Figure 4B:
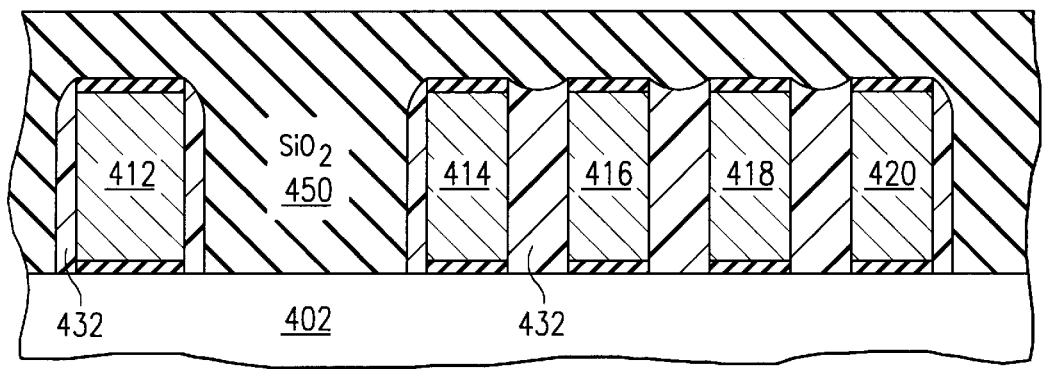
Figure 4C:
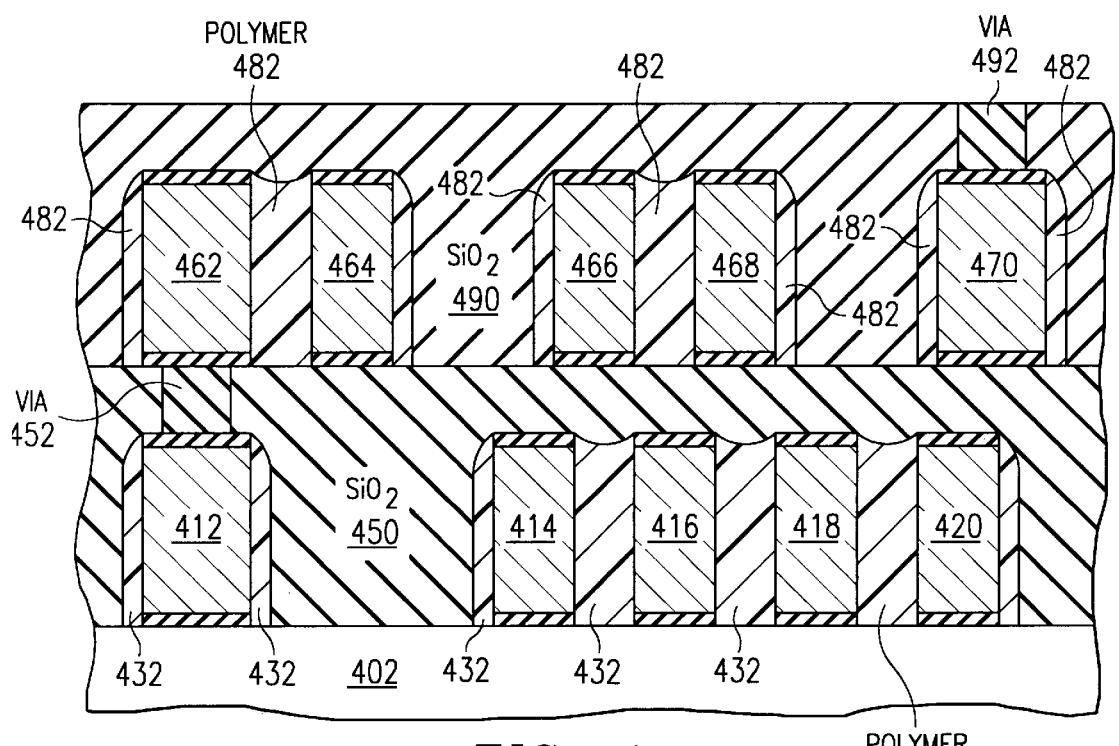

FIGS. 4a–c show two successive applications of the second preferred embodiment type of ILD for two successive metal levels. In particular, FIG. 4a shows fluorinated polydimethylenenaphthalene 430 conformally deposited over metal lines 412–420 on insulator 402. Metal lines 414–420 are about 0.25 $\mu$m wide and 0.7 $\mu$m high with 0.25 $\mu$m spacings, metal line 412 is about 0.4 $\mu$m wide and represents a widening of a metal line for vertical via connection. Again, the metal could be aluminum with cladding such as TiN on both the top and bottom.

FIG. 4b shows fluorinated polydimethylenenaphthalene 432 etched back to fill between the closely spaced metal lines and form sidewalls on the others. FIG. 4b also shows planarized oxide 450 covering the metal lines and fluorinated polydimethylenenaphthalene to a thickness of about 0.7 $\mu$m. Oxide 450 could be plasma-enhanced deposited with simultaneous sputtering for planarization, or could use a sacrificial layer etchback for planarization.

FIG. 4c shows metal-filled via 452 connecting first level metal line 412 through oxide 450 up to second level metal line 462 together with other second level metal lines 464–470 on oxide 450. Etched back fluorinated polydimethylenenaphthalene 482 fills in between closely spaced metal lines 462–470 and forms sidewalls spacers on others, and planarized oxide 490 covers the second level metal lines. Metal-filled via 492 connects second level metal line 470 to third level metal lines (not shown) later formed on oxide 490. Metal-filled vias 452 and 492 may be formed by first photolithographic patterning and etch the oxide followed by filling with tungsten through either blanket deposition plus etchback or selective deposition. The metal lines are formed by blanket metal deposition followed by photolithographic patterning and anisotropic: etching.

Polymer refill preferred embodiment

Figure 5A:
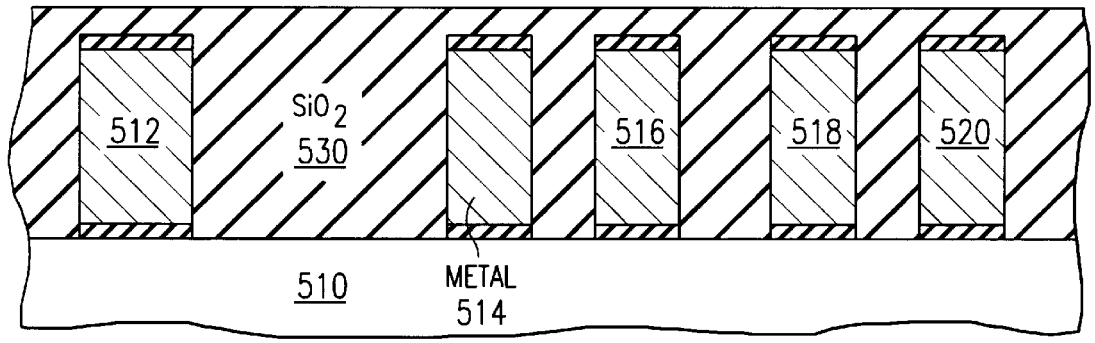
FIGS. 5a–d illustrate successive applications of the third preferred embodiment.

FIGS. 5a–d illustrate in cross sectional elevation views two successive applications of the third preferred embodiment type of IMD for two successive metal levels. Indeed, FIG. 5a shows metal lines 512–520 on insulating layer 510 and with planarized oxide layer 530 overlying the metal lines. Metal lines 514, 516, 518, and 520 have a minimal linewidth, about 0.25 $\mu$m wide, and a height of about 0.7 $\mu$m; whereas, metal line 512 indicates a width increase to about 0.4 $\mu$m for via alignment ease. The spacings between the metal lines in metal line pairs 514–516 and 518–520 are minimal, about 0.25 $\mu$m, but other spacings are larger. The metal lines are formed by blanket deposition followed by photolithographic patterning; the metal could be cladded aluminum.

Figure 5B:
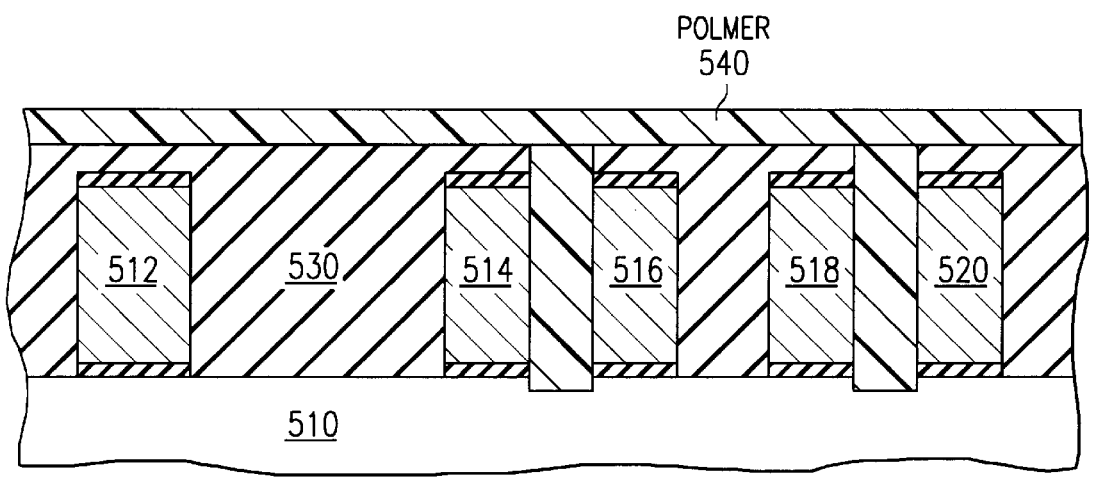

Photolithographically locate the minimal metal line spacings and etch oxide 530 out from the minimal spacings. The etch may be an anisotropic plasma etch or could be selective with respect to the metal and use the metal lines as lateral etchstops. An overetch into the underlying insulator 510 maybe used. After the oxide etch, conformally deposit fluorinated polydimethylenenaphthalene 540 as previously described; the conformal deposition to a thickness of at least 0.25 $\mu$m will fill the minimal spacings; see FIG. 5b illustrating a deposition of about 0.4 $\mu$m of polymer.

Figure 5C:
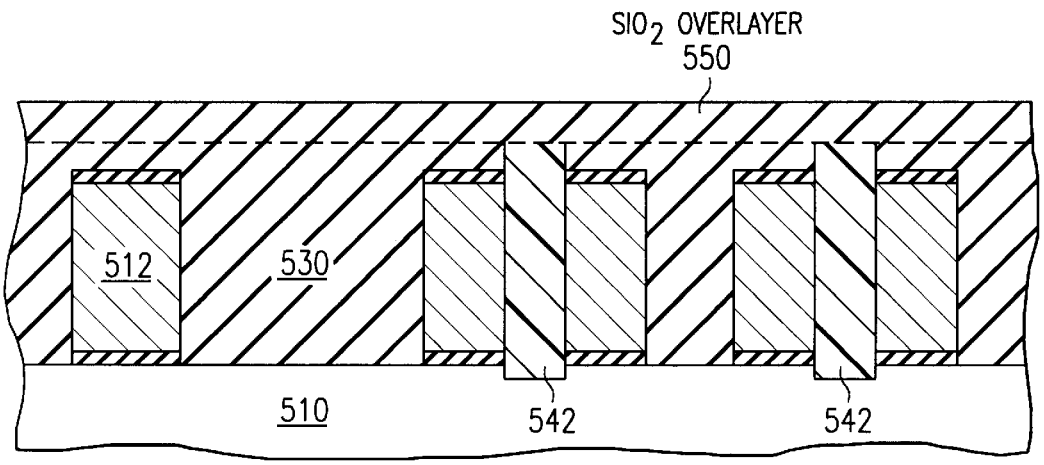
Figure 5D:
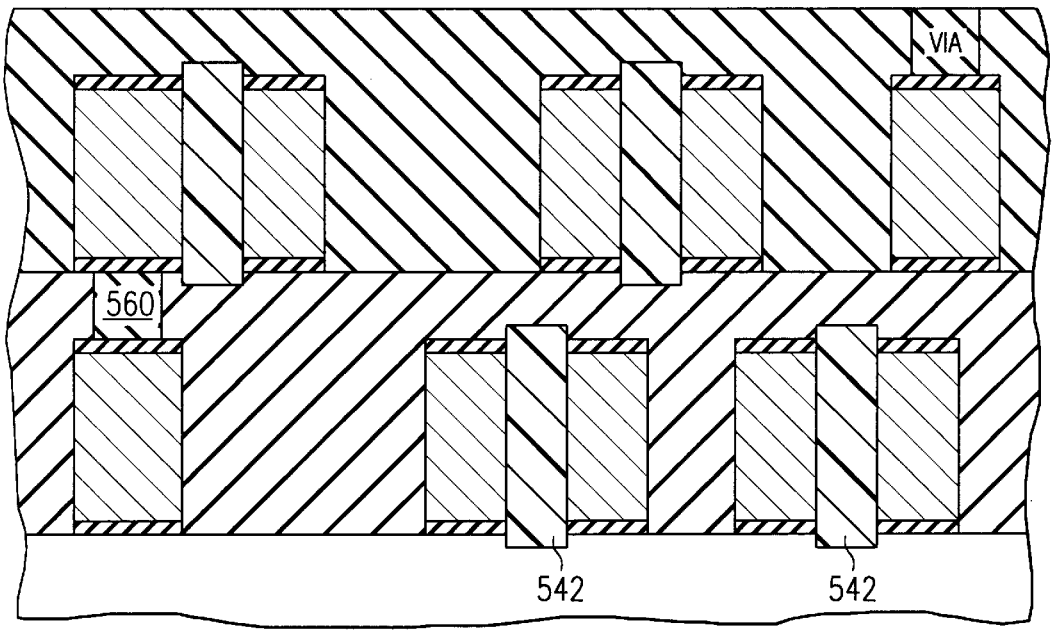

FIG. 5c shows an etchback of polymer 540 to leave only polymer fillers 542 in the minimal spacings. After the polymer etchback, deposit about 0.5 $\mu$m of oxide 550.

The metal level is completed by photolithographically defining and etching vias in oxides 530–550 to the wide portions of the metal lines such as metal line 512; then fill the vias by either selective metal deposition or blanket deposition and etchback. The vias may be filled with tungsten with a barrier layer. The metal-filled vias 560 provide connection to a second metal level which is formed in the same manner as the metal level just described; see FIG. 5d. An alternative would be to deposit the metal which fills vias 560 and is patterned to form the second level metal lines as a single step. This could be any conformal metal deposition method such as chemical vapor deposition or a reflow of metal such as aluminum; optionally a sputtered barrier metal layer could be initially deposited.

Modifications

Modifications of the fluorinated polydimethylenenaphthalene can be made while retaining most of its properties. For example, the fluorination could be varied by increasing or decreasing the number of fluorines on the fused rings and/or decreasing the number of fluorines on the aliphatic carbons, such as:

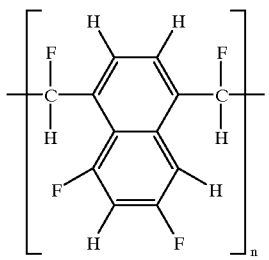

-continued

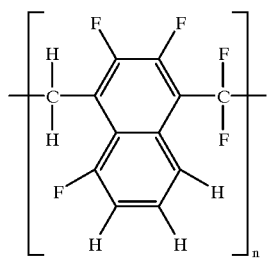

Further, simple fluorinated groups, such as $CF_3$, $C_2F_5$, $C_3F_7$, ..., could be substituted on the rings, for example,

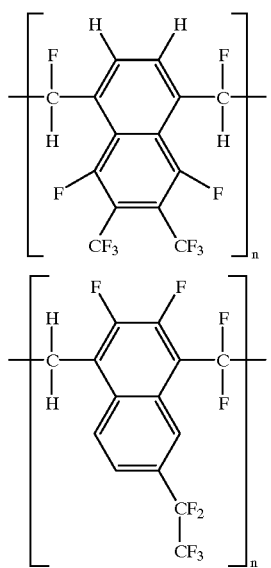

Indeed, copolymers of monomers with differing fluorine content could be used.

What is claimed is:

1. An integrated circuit insulation material, comprising:

(a) a polymer derived from the monomers:

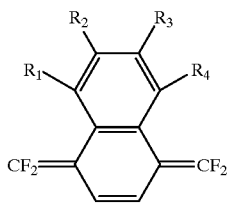

(b) wherein each of $R_1$, $R_2$, $R_3$, and $R_4$ is selected from the group consisting of H, F, and fluorocarbon groups.

2. The insulation material of claim 1, wherein:

(a) each of said $R_1$, $R_2$, $R_3$, and $R_4$ is F.

3. A precursor for vapor deposition polymerization, comprising:

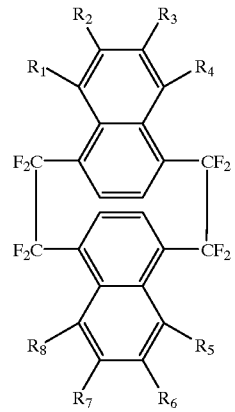

wherein each of $R_1$, $R_2$, $R_3$, $R_4$, $R_5$, $R_6$, $R_7$, and $R_8$ is selected from the group consisting of H, F, and fluorocarbon groups.

4. The precursor of claim 3, wherein:

(a) each of said $R_1$, $R_2$, $R_3$, $R_4$, $R_5$, $R_6$, $R_7$, and $R_8$ is F.

5. An integrated circuit with first and second conductor levels and an interlevel insulation layer, comprising:

(a) a first region of a silicon oxide, and (b) a second region of a fluoropolymer derived from the monomers

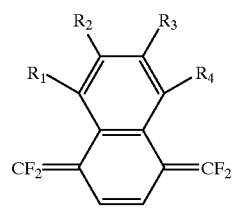

wherein each of $R_1$, $R_2$, $R_3$, and $R_4$ is selected from the group consisting of H, F, and fluorocarbon groups.

* * * * *